US009318450B1

(12) United States Patent
Reza et al.

(10) Patent No.: US 9,318,450 B1
(45) Date of Patent: Apr. 19, 2016

(54) PATTERNED CONDUCTIVE EPOXY HEAT-SINK ATTACHMENT IN A MONOLITHIC MICROWAVE INTEGRATED CIRCUIT (MMIC)

(71) Applicant: Raytheon Company, Waltham, MA (US)

(72) Inventors: Shahed Reza, Boxborough, MA (US); David H. Altman, Framingham, MA (US); Susan C. Trulli, Lexington, MA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/551,358

(22) Filed: Nov. 24, 2014

(51) Int. Cl.
*H01L 23/66* (2006.01)
*H01L 23/367* (2006.01)
*H01L 23/535* (2006.01)

(52) U.S. Cl.
CPC .............. *H01L 23/66* (2013.01); *H01L 23/367* (2013.01); *H01L 23/535* (2013.01); *H01L 2223/6605* (2013.01); *H01L 2223/6683* (2013.01)

(58) Field of Classification Search
CPC ............ H01L 23/66; H01L 2223/6683; H01L 23/3737; H01L 2223/6611; H01L 2223/6627; H01L 2223/6605
See application file for complete search history.

(56) References Cited

U.S. PATENT DOCUMENTS 4,092,697 A * 5/1978 Spaight ......................... 361/718
4,286,135 A * 8/1981 Green et al. .................. 219/746
4,951,014 A * 8/1990 Wohlert et al. ............... 333/246
5,931,222 A * 8/1999 Toy et al. ..................... 165/80.3
6,315,038 B1 * 11/2001 Chiu ............................ 165/185
6,349,033 B1 * 2/2002 Dubin et al. .................. 361/704
(Continued)

FOREIGN PATENT DOCUMENTS

EP 0 592 002 A2 4/1994
EP 0 592 002 A3 4/1994
(Continued)

OTHER PUBLICATIONS

Lau, B. L. "Development of Package Level Hybrid Silicon Heat Sink for Hotspots Cooling" 2013 IEEE 15th Elec. Pack. Tech. Conf. Dec. 13, 2013 pp. 741-746.*
(Continued)

*Primary Examiner* — Matthew Landau
*Assistant Examiner* — Grant Withers
(74) *Attorney, Agent, or Firm* — Daly, Crowley, Mofford & Durkee, LLP

(57) ABSTRACT

A monolithic microwave integrated circuit structure having: a semiconductor substrate structure having a plurality of active devices and a microwave transmission line having an input section, an output section and a interconnecting section electrically interconnecting the active devices on one surface of the substrate; a thermally conductive, electrically non-conductive heat sink; and a thermally conductive bonding layer for bonding the heat sink to the substrate, the thermally conductive bonding layer having an electrically conductive portion and an electrically non-conductive portion, the electrically conductive portion being disposed between the heat sink and an opposite surface of a portion of the substrate having the active devices and the electrically non-conductive portion being disposed on the opposite surface portion overlaying portion of the microwave transmission line section.

7 Claims, 5 Drawing Sheets

(56) References Cited

U.S. PATENT DOCUMENTS

| | | | | |
|---|---|---|---|---|
| 6,713,792 | B2 * | 3/2004 | van der Windt | 257/252 |
| 7,147,367 | B2 * | 12/2006 | Balian et al. | 374/44 |
| 7,180,174 | B2 * | 2/2007 | Koning et al. | 257/706 |
| 7,535,715 | B2 * | 5/2009 | Chung | 361/707 |
| 7,800,908 | B2 * | 9/2010 | Schulz-Harder et al. | 361/708 |
| 8,643,184 | B1 * | 2/2014 | Zhang et al. | 257/758 |
| 2003/0077478 | A1 * | 4/2003 | Dani et al. | 428/673 |
| 2003/0117775 | A1 * | 6/2003 | Vrtis et al. | 361/705 |
| 2003/0128521 | A1 * | 7/2003 | Matayabas et al. | 361/705 |
| 2003/0129863 | A1 * | 7/2003 | Alcoe et al. | 439/73 |
| 2003/0143382 | A1 * | 7/2003 | Xu | 428/209 |
| 2004/0124526 | A1 * | 7/2004 | Matayabas et al. | 257/712 |
| 2004/0125565 | A1 * | 7/2004 | Chen et al. | 361/704 |
| 2005/0041406 | A1 * | 2/2005 | Matayabas et al. | 361/784 |
| 2007/0001310 | A1 * | 1/2007 | Hua et al. | 257/762 |
| 2007/0057365 | A1 * | 3/2007 | Wong | 257/712 |
| 2007/0131913 | A1 * | 6/2007 | Cheng et al. | 252/500 |
| 2007/0152325 | A1 * | 7/2007 | Dani et al. | 257/717 |
| 2007/0158823 | A1 * | 7/2007 | Dani et al. | 257/712 |
| 2008/0012103 | A1 * | 1/2008 | Foster et al. | 257/675 |
| 2009/0166854 | A1 * | 7/2009 | Jewram et al. | 257/713 |
| 2009/0214870 | A1 * | 8/2009 | Morita et al. | 428/413 |
| 2009/0242988 | A1 * | 10/2009 | Tamura | 257/347 |
| 2009/0315637 | A1 * | 12/2009 | Rofougaran | 333/105 |
| 2009/0321922 | A1 * | 12/2009 | Shankar et al. | 257/706 |
| 2010/0157538 | A1 * | 6/2010 | Wang et al. | 361/704 |
| 2010/0181663 | A1 * | 7/2010 | Iruvanti et al. | 257/713 |
| 2010/0219524 | A1 * | 9/2010 | Shen et al. | 257/690 |
| 2010/0224980 | A1 * | 9/2010 | Chahal et al. | 257/690 |
| 2010/0302739 | A1 * | 12/2010 | Wang et al. | 361/713 |
| 2010/0328895 | A1 * | 12/2010 | Bhagwagar et al. | 361/704 |
| 2011/0018126 | A1 * | 1/2011 | Kling et al. | 257/713 |
| 2011/0147916 | A1 * | 6/2011 | Su | 257/692 |
| 2011/0174428 | A1 * | 7/2011 | Yamamoto | 156/182 |
| 2012/0063097 | A1 * | 3/2012 | Reza et al. | 361/720 |
| 2012/0285673 | A1 * | 11/2012 | Cola et al. | 165/185 |
| 2013/0042972 | A1 * | 2/2013 | Timmerman et al. | 156/275.5 |
| 2013/0208434 | A1 * | 8/2013 | Alm | 361/783 |
| 2014/0138854 | A1 * | 5/2014 | Arora | 257/782 |
| 2014/0231117 | A1 * | 8/2014 | Yip et al. | 174/50 |
| 2015/0097633 | A1 * | 4/2015 | DeVries et al. | 333/33 |
| 2015/0130045 | A1 * | 5/2015 | Tseng et al. | 257/712 |
| 2015/0137310 | A1 * | 5/2015 | Fillmore et al. | 257/522 |

FOREIGN PATENT DOCUMENTS

| | | |
|---|---|---|
| EP | 1 030 368 A1 | 8/2000 |
| EP | 1 942 524 A2 | 7/2008 |
| EP | 1 942 524 A3 | 7/2008 |

OTHER PUBLICATIONS

Ravi Prasher, Thermal Interface Materials: Historical Perspective, Status, and Future Directions, Proceedings of the IEEE, vol. 94, No. 8, Aug. 2006, pp. 1571-1586.

Goija et al. "A Coplanar-to-Microstrip Transition for W-band Circuit Fabrication with 100-mu m-thick GaAs Wafers;" IEEE Microwave and Guided Wave Letters, vol. 3, issue 2; Feb. 1993; pp. 29-31.

Kobayashi et al. "A 50 MHz-30 GHz Broadband Co-Planar Waveguide SPDT PIN Diode Switch with 45-dB isolation;" IEEE Microwave and Guided Wave Letters, vol. 5, issue 2; Feb. 1995; pp. 56-58.

PCT International Search Report and Written Opinion of the ISA dated Nov. 23, 2011; for Pat. App. No. PCT/US2011/049039; 14 Pages.

Radisic et al. "A High-Performance 85-119 GHz GCPW MMIC Low Noise Amplifier;" 2000 IEEE Digest of Papers; Jun. 2000; pp. 43-46.

Micovic et al. "Ka-band MMIC Power Amplifier in GaN HFET Technology;" 2004 IEEE MTT-S International Microwave Symposium Digest; Jun. 2004; pp. 1653-1656.

Sequeira et al. "Monolithic GaAs W-band Pseudomorphic MODFET Ampliphiers;" $12^{th}$ Annual Technical Digest 1990; Oct. 1990; pp. 161-164.

* cited by examiner

PATTERNED CONDUCTIVE EPOXY HEAT-SINK ATTACHMENT IN A MONOLITHIC MICROWAVE INTEGRATED CIRCUIT (MMIC)

TECHNICAL FIELD

This disclosure relates generally to monolithic microwave integrated circuits (MMICs) and more particularly to MMICs having heat sinks.

BACKGROUND AND SUMMARY

As is known in the art, for high power Coplanar Waveguide (CPW) MMICs, such as AlGaN/GaN high power amplifiers (HPAs), heat removal is critical for circuit performance and reliability. Current heat sinking methods for GaN MMICs include bonding the back side of the MMIC (the side opposing to the active layer containing active device and transmission lines) to a heat spreader/sink using a thermally conductive epoxy or bonding layer.

As is known in the art, there are two types of thermally conductive epoxies: electrically insulating epoxies (electrically insulating, electrically non-conductive or poorly-conductive epoxies, hereinafter referred to as electrically non-conductive epoxies), are filled with electrically non-conductive materials, with electrical conductivity typically less than 1 Siemens per meter, such as, for example, Aluminum Nitride (AlN) or Alumina ($Al_2O_3$) particles; and electrically conductive epoxies, such as epoxies filled with electrically conductive particles, with electrical conductivity higher than $10^3$ Siemens (or mhos) per meter, typically on the order of $10^7$ Siemens per meter, such as Silver (Ag) flakes. Electrically conductive epoxies, can provide >5-fold reduction in Thermal Interface Material (TIM) resistance compared with electrically non-conductive epoxies because of their high thermal conductivity filler, increased percolation afforded by filler geometry and/or improved rheology and viscosity leading to thinner bond-lines, compared to electrically non-conductive epoxies. See R. Prasher, "Thermal Interface Materials: Historical Perspective, Status and Future Directions," Proceedings of the IEEE, Vol 94. No. 8. 2006. Even when compared to electrically non-conductive epoxies filled with high thermal conductivity fillers such as boron nitride (BN) and diamond, electrically conductive epoxies provide a lower TIM resistance than electrically non-conductive epoxies.

Ideally, an electrically conductive bond layer would be employed for the attachment of the MMIC to the heat sink in order to further minimize the TIM resistance. However, the inventors have recognized that a blanket application of an electrically conductive layer provides a continuous electrically conductive plane under the layer containing active device and transmission lines, and as a result, unwanted Parallel Plate or Waveguide moding can be supported between this plane and the front-side metallization of the CPW MMIC. These modes often interfere with circuit operation and can therefore render the circuit completely nonoperational. Moding provides feedback that can enable unwanted RF oscillations. Even if stable, moding can affect matching circuits, particularly for higher-order harmonic tuning. A method for mode suppression by partial removal of electrically conductive back plane and heat sink is described in U.S. Patent Application Publication No 2012/0063097, inventors Reza et al, assigned to the same assignee as the present invention.

In accordance with the present disclosure, a monolithic microwave integrated circuit structure is provided having: a semiconductor substrate structure having a plurality of active devices and microwave transmission lines having an input section, an output section and a interconnecting section electrically interconnecting the active devices on one surface of the substrate; a thermally conductive, electrically insulating heat sink; and a thermally conductive bonding layer for bonding the heat sink to the substrate, the thermally conductive bonding layer having an electrically conductive portion and a electrically insulating portion, the electrically conductive portion being disposed between the heat sink and an opposite surface of a portion of the substrate having the active devices and the electrically non-conductive portion being disposed on the opposite surface portion overlaying portion of the microwave transmission line section.

In one embodiment, the electrically non-conductive portion overlays a portion of the at least one of the input section and the output section.

In one embodiment, the electrically non-conductive portion overlays at least a portion of the interconnecting section.

In one embodiment, the electrically non-conductive portion overlays at least a middle region of the chip, the middle region being a portion of the microwave transmission line section between the input section and the output section.

In one embodiment, the electrically non-conductive portion overlays a plurality of different portions of the microwave transmission line section.

In one embodiment, the electrically conductive portion has an electrical conductivity more than 1000 times greater than the electrical conductivity of the electrically non-conductive portion.

With such an arrangement, co-curing selectively patterned electrically conductive and electrically non-conductive epoxies achieves low thermal resistance die attach while simultaneously suppressing parallel-plate moding that would otherwise be detrimental to MMIC operation. This is achieved by positioning the electrically conductive epoxy in locations where it enhances thermal management of high dissipation regions of the MMIC (e.g., beneath FETs) while simultaneously positioning electrically non-conductive epoxy in locations beneath the microwave transmission line section to prevent Parallel Plate moding.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
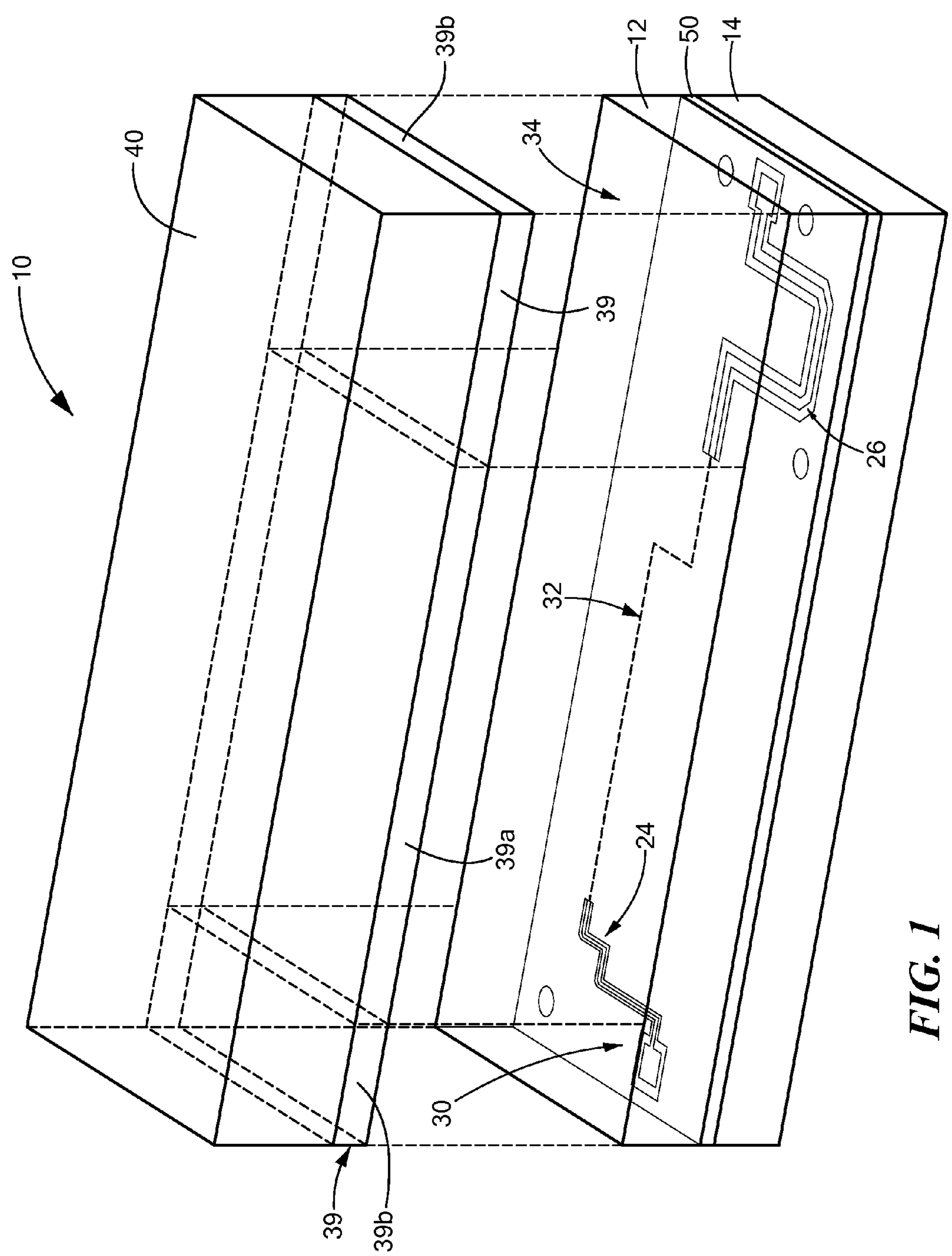
FIG. 1 is an exploded, diagrammatical sketch of a monolithic microwave integrated circuit (MMIC) structure according to the disclosure.
Figure 2:
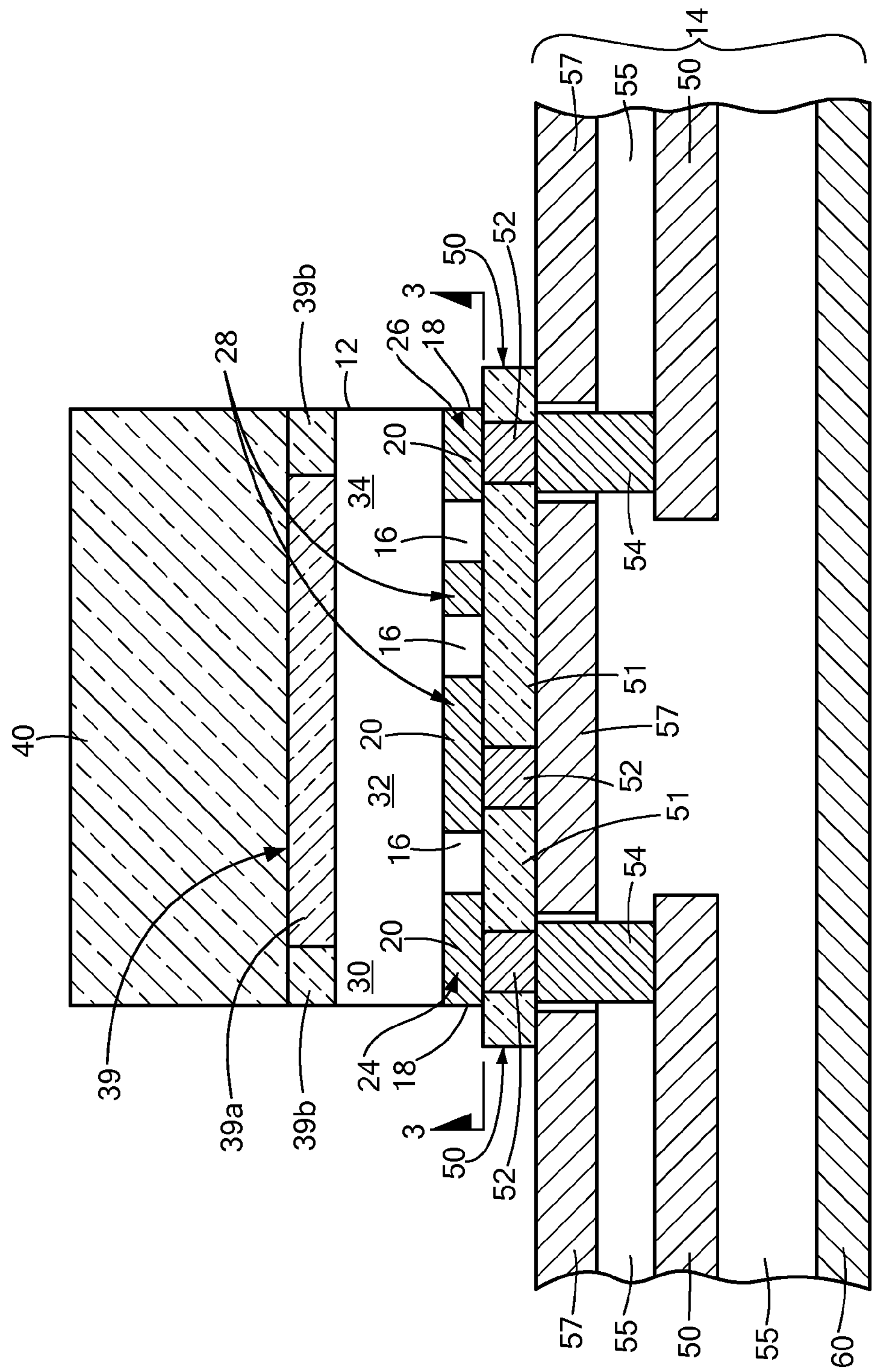
FIG. 2 is a cross sectional, diagrammatical sketch of a monolithic microwave integrated circuit (MMIC) structure of FIG. 1.
Figure 3:
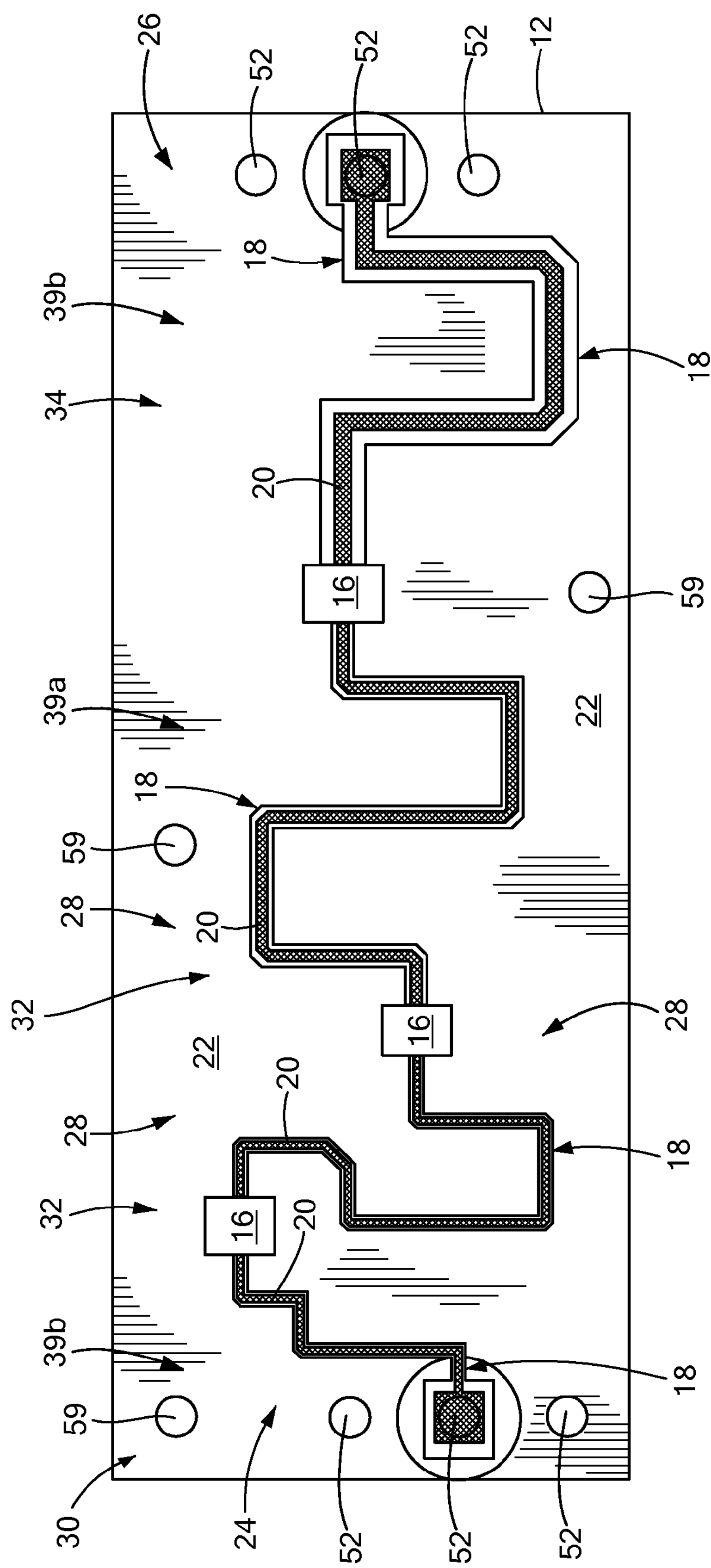
FIG. 3 is a plan view of a surface of the MMIC of FIG. 2 looking along line 3-3 of FIG. 2.

Referring now to FIGS. 1, 2 and 3, a monolithic microwave integrated circuit (MMIC) structure 10 is shown. The structure 10 includes an MMIC chip 12 mounted on the printed circuit board (PCB) 14 in flip-chip configuration. More particularly, the MMIC structure 10 includes: a semiconductor substrate structure or chip 12, here for example, Gallium Nitride (GaN) on silicon carbide (SiC) having a plurality of active devices 16 (e.g., transistors) formed in a bottom surface portion of the substrate structure 12, here arranged as a plurality of, here, for example, three microwave amplifiers (FIG. 3); and a microwave transmission line section 18, here for example, a coplanar waveguide (CPW) microwave transmission line section 18, formed on the bottom surface of the substrate structure 12. As is known, the CPW has strip conductors 20 separated from a coplanar ground plane conductor 22 by portions of the semiconductor substrate 12. The CPW has an input section 24, an output section 26 and interconnecting sections 28 electrically connected between the input section 24 and the output section 26. The interconnecting section 28 interconnects active devices 16, here, for example, three electrically interconnected microwave amplifiers, as indicated in FIG. 3.

The semiconductor substrate structure 12 includes: a first peripheral region 30 disposed on the top surface thereof (prior to being flip-chip mounted to the PCB) over the input section 24; an inner region 28 disposed on the top surface thereof over the interconnecting section 32; and a second peripheral region 34 disposed on the top surface thereof over the output section 26.

The MMIC structure 10 includes a thermally conductive, electrically non-conductive heat sink 40 bonded to the top surface portion of the substrate structure 10 by a thermally conductive boding layer 39. The heat sink 40 is here, for example, Silicon, Aluminum Nitride (AlN) or Beryllium Oxide (BeO) The thermally conductive bonding layer 39 has in inner region 39*a* disposed within an outer region 39*b*. The outer region 39*b* is a thermally conductive, electrically non-conductive epoxy, loaded with electrically non-conductive materials; here for example, Aluminum Nitride (AlN) or Boron Nitride (BN); and the inner region 39*a* is a thermally conductive, electrically conductive epoxy, such as an epoxy filled with electrically conductive particles such as Silver (Ag) flakes. It is noted that the outer region 39*b* overlays a portion of the microwave transmission line section 18; here both the 24 input section and the output section 26. The inner region 39*b* is disposed between the heat sink 40 and an opposite surface of a portion of the substrate 12 having the active devices 16.

Here, both the inner region 39*a* and the outer region 39*b* of the bonding layer 39 are applied in a patterned fashion by, for example, robotically dispensing of the bonding layer 39 through a syringe with a screw auger, the heat sink 40 is positioned on the applied bonding layer, and then both the inner region 39*a* and the outer region 39*b* of the bonding layer 39 are thermally cured simultaneously. Thus, the outer region 39*b* is disposed over the input section 24 and the output section 26 inner region 39*a* is disposed over the interconnecting sections 28.

The PCB 14 has vias 54 (FIG. 2) passing from the upper surface thereof through the electrically non-conductive 55 of the PCB 14 to electrical conductors 50 within the PCB 14, such vias 54 being aligned to the solder bumps 52, as indicated. The PCB has a ground plane conductor 60.

To solve the moding thru the under-fill material 51, ground bumps 59 in addition to the ground-signal-ground bumps 52 were added. These bumps connect the top metal of the MMIC to the top metal layer of the board. The additional bumps 59 connect the ground plane conductor 22 (FIG. 3) of the MMIC 12 to the top metal layer 57 of the PCB board. The bumps 59 are placed strategically so that moding thru the under-fill material is suppressed without hindering circuit operation.

Figure 4:
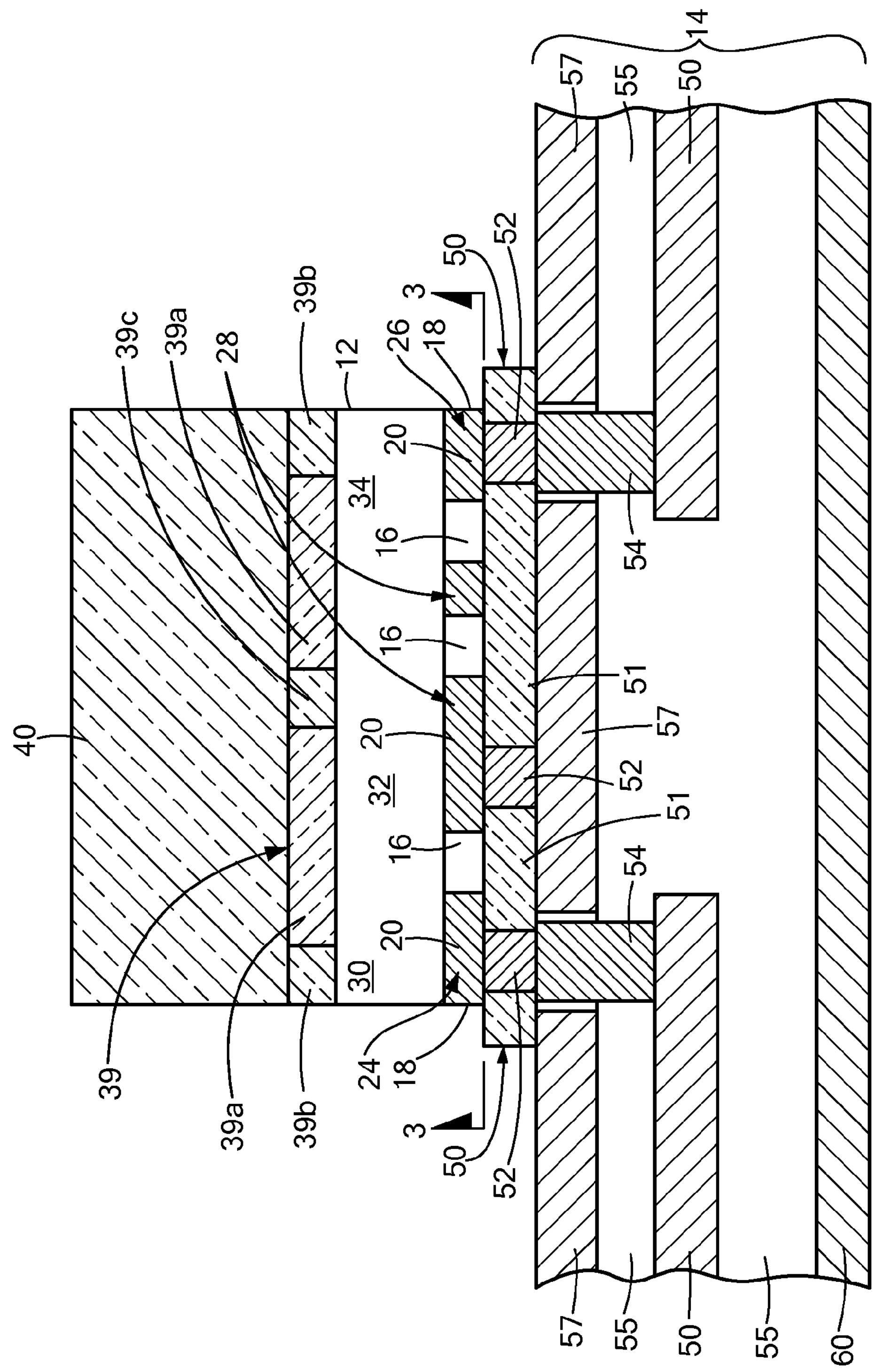
FIG. 4 is a cross sectional, diagrammatical sketch of a monolithic microwave integrated circuit (MMIC) structure according to another embodiment of the disclosure.

Referring now to FIG. 4, here the bonding layer 39 has a third region 39*c* positioned over a middle region of the microwave transmission line section 28, as shown. Here the third region 39*c* is an electrically non-conductive, thermally conductive epoxy, similar to that used in the outer region 39*b*.

Figure 5:
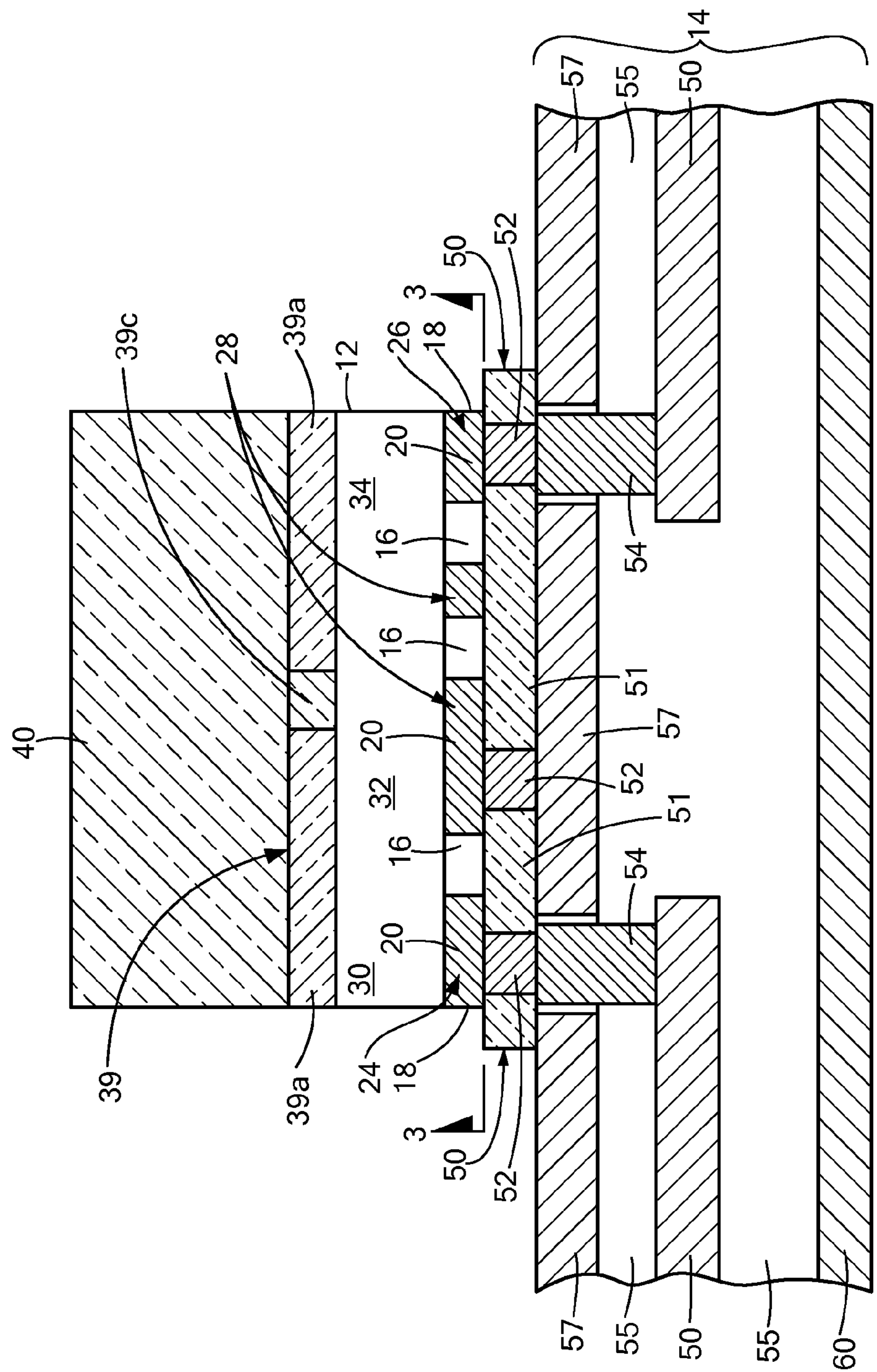
FIG. 5 is a cross sectional, diagrammatical sketch of a monolithic microwave integrated circuit (MMIC) structure according to another embodiment of the disclosure.

Referring now to FIG. 5, here the bonding layer 39 has the third region 39*c* positioned over a middle region of the microwave transmission line section 28 and the regions 39*a* of thermally conductive, electrically conductive bond layer extends to the outer edges of the chip (that is, the regions 39*b* are here, in this embodiment, replaced by thermally conductive, electrically conductive bond layer), as shown. Here the third region 39*c* is an electrically non-conductive, thermally conductive epoxy.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A monolithic microwave integrated circuit structure, comprising:

a semiconductor substrate structure, comprising:

a plurality of active devices; and a microwave transmission line section having: an input section; an output section; and, a interconnecting section electrically interconnecting the active devices on one surface of the substrate;

a thermally conductive, electrically non-conductive heat sink; and a thermally conductive bonding layer for bonding the heat sink to an opposite surface of the substrate, the thermally conductive bonding layer comprising:

an electrically conductive layer portion of a first material extending vertically from the heat sink to the opposite surface of the substrate; and, an electrically non-conductive layer portion of a second material disposed laterally of the electrically conductive portion and extending vertically from the heat sink to the opposite surface of the substrate;

wherein the electrically conductive layer portion and the electrically non-conductive layer portion are in a non-overlapping relationship wherein the first material is different from the second material;

wherein the electrically conductive portion is disposed between the heat sink and a first region on said opposite surface of the substrate, the first region directly overlaying the active devices; and, wherein the electrically non-conductive portion is disposed between the heat sink and a second region on said opposite surface of the substrate, the second region directly overlaying a portion of the microwave transmission line section.

2. The monolithic microwave integrated circuit structure recited in claim 1 wherein the electrically non-conductive portion overlays a portion of at least one of the input section and the output section.

3. The monolithic microwave integrated circuit structure recited in claim 1 wherein the electrically non-conductive portion overlays at least a portion of the interconnecting section.

4. The monolithic microwave integrated circuit structure recited in claim 1 wherein the semiconductor substrate structure is a semiconductor chip.

5. The monolithic microwave integrated circuit structure recited in claim 1 wherein the electrically non-conductive portion overlays at least a middle region of the substrate, the middle region being a portion of the microwave transmission line section disposed between the input section and the output section.

6. The monolithic microwave integrated circuit structure recited in claim 1 wherein the electrically non-conductive portion overlays a plurality of different portions of the microwave transmission line section.

7. The monolithic microwave integrated circuit structure recited in claim 1 wherein the electrically conductive portion has an electrical conductivity more than 1000 times greater than the electrical conductivity of the electrically non-conductive portion.

* * * * *